United States Patent [19]

Terranova et al.

[11] Patent Number: 5,356,509
[45] Date of Patent: Oct. 18, 1994

[54] HETERO-EPITAXIAL GROWTH OF NON-LATTICE MATCHED SEMICONDUCTORS

[75] Inventors: Nancy Terranova, Wilmington; Allen M. Barnett, Newark, both of Del.

[73] Assignee: AstroPower, Inc., Newark, Del.

[21] Appl. No.: 962,475

[22] Filed: Oct. 16, 1992

[51] Int. Cl.$^5$ ............................................. H01L 21/20
[52] U.S. Cl. ..................... 117/58; 437/105; 437/107; 437/126; 437/132; 437/133; 437/130; 437/89; 437/91; 117/95; 117/99; 117/934; 117/953
[58] Field of Search ............... 437/126, 130, 105, 107, 437/132, 133, 89, 90, 91, 92; 156/612; 148/DIG. 149, DIG. 169, DIG. 97

[56] References Cited

U.S. PATENT DOCUMENTS

| | | | |
|---|---|---|---|
| 3,368,125 | 2/1968 | Pasierb | 257/73 |
| 3,565,702 | 2/1971 | Nelson | 437/119 |
| 4,818,337 | 4/1989 | Barnett et al. | 437/89 |
| 4,826,784 | 5/1989 | Salerno et al. | 439/89 |
| 4,876,218 | 10/1989 | Pessa et al. | 148/DIG. 97 |
| 5,163,118 | 11/1992 | Lorenzo et al. | 437/126 |

FOREIGN PATENT DOCUMENTS

2139974 5/1990 Japan .

OTHER PUBLICATIONS

Fan, J. C. C. and J. M. Poate, "Heteroepitaxy on Silicon", Materials Research Soc. Symposia Proc., 67 (1986).

Fan, J. C. C., J. M. Phillips and B. Y. Tsaur "Heteroepitaxy on Silicon II", Materials Research Symposia Proc., 91 (1987).

Gottlieb, G. E. and J. F. Corboy, "Epitaxial Growth of GaAs Using Water Vapor", RCA Review 24, (4 Dec. 1963) 585–595.

Igarashi, O., "Selective Growth of Heteroepitaxial GaP on SI Substrates", J. Electrochemical Soc., 199 10 (Oct. 1972) 1430–1431.

Nicoll, F. H., "The Use of Close Spacing in Chemical Transport Systems for Growing Epitaxial Layers of Semiconductors", J. Electrochemical Soc., 110, 11 (Nov. 1963) 1165–1167.

Perrier, G., R. Philippe, and J. P. Dodelet, "Growth of Semiconductors by the Close Spaced Vapor Transport Technique", Journal of Materials Research, 3 (5) (Sep.-/Oct. 1988) 1031–1042.

Robinson, P., "Transport of Gallium Arsenide by Close Spaced Vapor Transport", RCA Review 24, 4 (Dec. 1963) 574.

Sakai, S., R. J. Matyi and H. Schichijo, "Selective Liquid Phase Epitaxy and Defet Reduction in GaAs Grown on a GaAs-coated Silicon by Molecular Beam Epitaxy", Applied Physics Letters, 51(23) (Dec. 7, 1987) 1913–1915.

Shaw, D. W., "Selective Epitaxial Deposition of Gallium Arsenide in Holes", J. Electrochemical Soc., 113, 9 (Sep. 1966) 904–908.

Soga, T., S. Hattori, S. Sakai, M. Takeyasu, and M. Umeno, "Characteristics of Epitaxially Grown GaAs on Si Substrates with III-V Compounds Intermediate Layers by Metalorganic Chemical Vapor Deposition", J. Applied Physics 57(10) (15 May 1985) 4578–1582.

Van der Ziel, J. P., R. A. Logan and N. Chand, "Characteristics of GaAs/AlGaAs Heterostructures Grown by Liquid-Phase Epitaxy on Molecular-Beam Coated (List continued on next page.)

*Primary Examiner*—R. Bruce Breneman
*Assistant Examiner*—Ramamohan Rao Paladugu
*Attorney, Agent, or Firm*—Ratner & Prestia

[57] ABSTRACT

A method for growing a compound semiconductor, such as GaAs or InP, on a non-lattice matched substrate, such as Si, utilizes close-spaced vapor transport to deposit nucleation enhancing interlayer and liquid phase epitaxy to form the compound semiconductor. When used in conjunction with a growth mask, the method is also adapted to selective area epitaxy.

26 Claims, 1 Drawing Sheet

OTHER PUBLICATIONS

GaAs on Si", J. Appl. Phys. 64(6) (15 Sep. 1988) 3201–3204.

Yazawa Y. et al., "High Quality GaAs Layers on Si Substrates Grown by the Hybrid Method Combing Molecular Beam and Liquid Phase Epitaxies", Journal of Applied Physics, vol. 69, No. 1, 1 Jan. 1991, pp. 273–277.

Casey, H. C., Jr. and M. B. Panish, "Heterostructure Lasers", Academic Press, New York, 1978.

Hseih, J. J., "Liquid Phase Epitaxy" Chap. 6, Handbook on Semiconductors, vol. 3, T. S. Moss and S. P. Keller, eds., Amsterdam, North Holland, 1980.

Chin, B. H. et al., "Preservation of Indium Phosphide Substrates", Journal of Electrochemical Soc., vol. 133, No. 10, (1986) pp. 2161–2164.

HETERO-EPITAXIAL GROWTH OF NON-LATTICE MATCHED SEMICONDUCTORS

STATEMENT OF GOVERNMENT RIGHTS

The U.S. Government has rights in this invention pursuant to Contract No. DAAL03-88-C-0023 awarded by the U.S. Army Research Office and Contract No. DASG60-89-C-0094 awarded by the U.S. Army Strategic Defense Command.

FIELD OF THE INVENTION

This invention relates to the field of art of methods for forming hetero-epitaxial layers of compound semiconductors, such as gallium arsenide and indium phosphide, on non-lattice matched substrates, such as silicon. The layers are useful for fabricating a variety of semiconductor devices, including optical integrated circuits, field effect transistors, light emitting diodes, solid state lasers, solar cells and the like.

BACKGROUND OF THE INVENTION

The formation of thin, single-crystal layers of compound semiconductors, such as gallium arsenide (GaAs) or indium phosphide (InP), on silicon (Si) substrates is useful for the fabrication of high performance microelectronic and opto-electronic devices. Applications Of these socalled hetero-epitaxial structures include high speed digital and microwave integrated circuits, monolithic integration of GaAs or InP light emitting components with Si logic and control circuits and high efficiency solar cells for space applications. Selective area epitaxy structures in which the compound semiconductor is grown preferentially in openings in an oxide masked substrate are of particular interest for device isolation, reduction in thermal stress, monolithic integration of compound semiconductor and silicon devices and epitaxial lateral overgrowth.

To date, much research effort has been devoted to developing so-called vapor phase epitaxy methods such as molecular beam epitaxy (MBE) and metal organic chemical vapor deposition (MOCVD) for forming single crystal layers of gallium arsenide or indium phosphide on silicon. On the other hand, the method of liquid phase epitaxy (LPE), which is preferred for industrial production of devices requiring the highest quality semiconductor materials, has not been adequately developed for growth of gallium arsenide or indium phosphide on silicon. This is largely due to the lattice mismatch of these materials with silicon. For example, the gallium arsenide crystal lattice is about 4% larger than silicon and the indium phosphide lattice is about 8% larger than silicon. Such mismatches are disadvantageous because lattice mismatches greater than about 1% are known to impede nucleation of epitaxial layers under LPE conditions. Recently, Y. Yazawa et al. in an article published in the *Journal of Applied Physics* Vol. 69, No. 1, 1 January 1991, pages 273-277 report attempts to combine MBE and LPE growth of gallium arsenide on silicon wherein a GaAs layer is overgrown by LPE on Si substrates coated with an initial MBE-grown GaAs layer. The MBE technique is of limited practical utility owing to the high cost of MBE equipment coupled with the low productivity that arises from the need for predeposition cleaning steps to remove, inter alia, superficial oxides and low deposition rates associated with MBE processing.

Therefore, it would be useful to have an effective method for growing an initial layer of material that would adequately seed the liquid phase epitaxial growth of a compound semiconductor on a dissimilar substrate.

An object of this invention is to provide a method for the liquid phase epitaxial growth of a compound semiconductor layer on a non-lattice matched substrate.

A further object of this invention is to provide a method for the liquid phase epitaxial growth of a compound semiconductor layer on a nonlattice matched substrate which utilizes apparatus that is simple in design and easy to operate.

A further object of this invention is to provide a method for the liquid phase epitaxial growth of a compound semiconductor layer on a nonlattice matched substrate which avoids the use of toxic or corrosive gases.

A further object of this invention is to provide a method for the liquid phase epitaxial growth of a compound semiconductor layer on a nonlattice matched substrate which is readily scaled up for large area substrates.

A further object of this invention is to provide a method for the liquid phase epitaxial growth of a compound semiconductor layer on a nonlattice matched substrate which is relatively insensitive to the presence of substrate surface oxides that can impede epitaxy.

A further object of this invention is to provide a method for the liquid phase epitaxial growth of a compound semiconductor layer on a nonlattice matched substrate which permits selective area epitaxy modes of growth.

SUMMARY OF THE INVENTION

A method for the growth of a compound semiconductor, such as GaAs or InP, on a non-lattice matched substrate, such as Si, comprises the steps of close-spaced vapor transport deposition of an interlayer over the substrate and liquid phase epitaxy formation of the compound semiconductor over the interlayer.

DETAILED DESCRIPTION

In accordance with the teachings of this invention, a process comprising close-spaced-vapor-transport (hereinafter referred to as CSVT) and liquid phase epitaxy (hereinafter referred to as LPE) is employed to achieve hetero-epitaxial growth of compound semiconductor layers on non-lattice matched substrates.

Figure 1A:
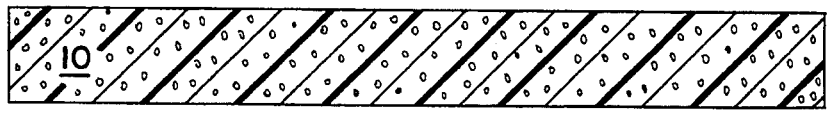
FIGS. 1a–1e illustrate selective area liquid phase epitaxial growth of a compound semiconductor formed on a non-lattice matched substrate in accordance with the teachings of this invention.

Referring to FIG. 1a, process step 1 of this invention comprises preparation of substrate 10. In a preferred embodiment substrate 10 is single crystal silicon in the (111) or (100) orientation. Substrate preparation step 1 comprises solvent and 1:1::sulfuric acid:hydrogen peroxide cleaning procedures which are standard in art such as those described by Burkman in *Semiconductor International*, July 1981, pp. 103–116 and which is incorporated by reference herein.

Figure 1B:
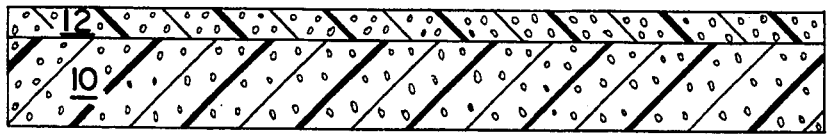

In process step 2, shown in FIG. 1b, growth mask 12 is formed over the surface of substrate 10. When the substrate is silicon a mask comprising silicon dioxide grown by thermal oxidation to a thickness of 0.05 to 0.5 microns is suitable and a thickness of 0.2 microns is preferred.

Figure 1C:
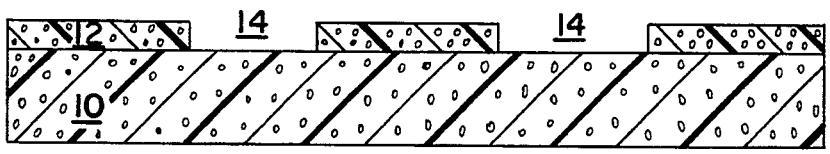

Openings 14 in mask 12, also known as "vias", are formed in step 3, shown in FIG. 1c, using patterning and etching techniques known in art. Photolithography and chemical etching are preferred for step 3, although other methods of patterning, such as screen printing, and methods of etching, such as plasma etching, are within the scope of this invention; as is substitution with selective deposition in a predetermined pattern for steps 2 and 3. The orientation, width and spacing of vias 14 are chosen to maximize the area of subsequent film grown by LPE over the oxide mask in relation to the area over the via. In general, either stripe pattern (shown in the Figures) comprising parallel grooves 2 to 25 microns wide and spaced 10 to 500 microns apart or an array of circular openings 5 to 25 microns in diameter, spaced 10 to 500 microns may be used.

Figure 1D:
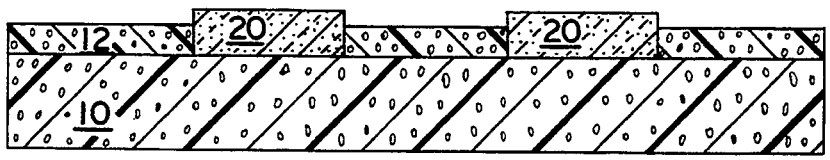
Figure 1E:
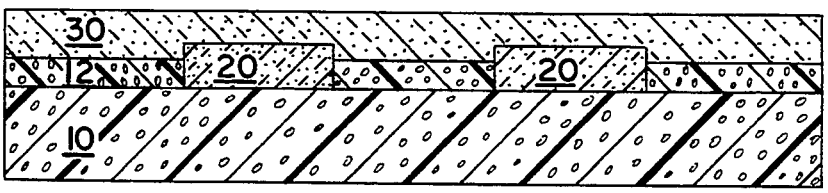

The areas of exposed substrate at the base of the vias function as sites of preferential nucleation of interlayer 20 which is formed next in step 4 of the invention. Step 4, shown in FIG. 1d, comprises selectively growing by the CSVT method interlayer 20 in the vias 14 in oxide mask 12 over the exposed portions of substrate 10. Interlayer 20 is of a material that is lattice-matched to compound semiconductor 30 which is formed in step 5 by LPE. When selected in accordance with the teaching of this invention, interlayer 20 enhances the nucleation of semiconductor 30. The LPE growth in step 5 shown in FIG. 1e, in accord with the teachings of this invention, proceeds by selective nucleation and growth on interlayer 20 and eventual lateral overgrowth over oxide mask 12 to form a continuous layer of semiconductor material 30. Among the compound semiconductor materials suitable for semiconductor 30 within the teachings of this invention are GaAs, AlGaAs, InP, GaInP and GaInAsP.

When the semiconductor 30 is GaAs or AlGaAs, interlayer 20 is GaAs at a thickness of 0.2 to 1 micron. When semiconductor 30 is InP, interlayers of InP or a combination of InP and GaAs are suitable with InP at a thickness of 0.2 to 0.5 microns preferred.

In any case, step 4 in accordance with the teachings of this invention is carried out by the CSVT method using procedures and apparatus known in the art such as those described by U.S. Pat. No. 3,368,125 to Pasierb, which is incorporated by reference herein. For example, CSVT growth of GaAs as interlayer 20 in step 4 may be achieved at atmospheric pressure with a substrate temperature, $T_{sub}$, of 700° to 800° C., a source-substrate temperature difference, T, of 25° to 100° C., a source to substrate distance, d, of 0.5 to 3 millimeters, a transport agent comprising water vapor in hydrogen or nitrogen at a concentration of 1000 to 2000 parts-per-million by volume, at a flow rate, Q, of 500 to 3000 standard cubic centimeters per minute and a growth rate, GR, of 0.1 to 1 microns per minute. The following conditions for CSVT of GaAs in accordance with this invention are preferred: $T_{sub}=800°$ C.; T=25° C.; d=0.7 mm; 1000 ppm$_v$ water in $H_2$ at Q=2000 sccm and GR=0.5 micron/min.

Applicants have found that a GaAs interlayer formed by CSVT also has the feature of high resistivity. High resistivity provides for isolation between the silicon substrate 10 and semiconductor 30 which is desirable for fabrication of devices made possible by this invention, such as monolithic optical integrated circuits and the like. Applicants have also found that when interlayer 20 is grown with appropriate conductivity type and carrier concentration, the interlayer can additionally function as an active semiconductor such as the base in a light emitting diode.

The CSVT growth of InP as interlayer 20 in step 2 prior to LPE growth of InP as semiconductor 30 may be achieved at atmospheric pressure with a substrate temperature, $T_{sub}$, of 700 to 800° C., a source-substrate temperature difference, T, of 100° to 30° C., a source to substrate distance, d, of 0.3 to 0.5 millimeters, a transport agent comprising hydrogen chloride in a mixture of 15% hydrogen in nitrogen at a concentration near saturation, at flow rate, Q, of about 7 standard cubic cent%meters per minute and a growth rate, GR, of 0.09 to 0.3 micron per minute. The following conditions for CSVT of InP in accordance with this invention are preferred: $T^{sub}=800°$ C.; T=30° C.; d=0.5 mm; 0.034% (vol) HCl in $H_2/N_2$ at Q=6.9 sccm and GR=0.3 micron/min.

LPE growth step 5 is carried out using methods and apparatus known in the art Such as those taught by U.S. Pat. No. 3,565,702 to Nelson, which is incorporated by reference herein, including the sliding boat method, which is preferred.

LPE growth of GaAs semiconductor 30 over a GaAs interlayer 20 in accord with the teachings of this invention may be carried out using either a Ga rich solution or a Bi solvent in which Ga and As are dissolved. Bi is preferred in view of the following: silicon is less soluble in molten Bi than Ga so that exposed areas of the silicon substrate are not subject to attack by the LPE growth solvent as is the case with Ga; Bi is less susceptible to oxidation than Ga so that the extensive bake-out procedures which are required to remove residual oxides in the case of Ga are not needed; Bi is a solid at room temperature, melting at 271° C. compared to 30° C. for Ga, making loading and cleaning the LPE apparatus much easier than with Ga; GaAs is less soluble in Bi than in Ga and the temperature dependence of the solubility of GaAs in Bi is less than in Ga so that it is easier to control thickness of the LPE layer, especially when such layers are thin; and Bi has lower surface tension than Ga so that Bi wets the surface of interlayer 20 more readily than Ga which results in smoother, more uniform LPE GaAs layers. It is also preferred to add a small amount of Ga to the Bi melt to further improve wetting and to provide excess Ga in the liquid phase which, it is speculated, suppresses formation of Ga vacancies and As anti-site defects. Typically, melts comprising 7 grams of Bi and 100 to 500 milligrams of Ga are employed with As and additional Ga entering the melt upon saturation with the GaAs source.

The conductivity type and carrier concentration of the LPE GaAs are controlled by addition of dopants to the solution. For n-type doping, addition of Si or Sn is suitable, with Sn preferred; while for p-type doping, Ge or Zn may be used and Ge is preferred.

For example, a CSVT GaAs interlayer 20 on silicon substrates 10 was employed to seed the LPE growth of GaAs semiconductor 30. To increase the thermodynamic driving force for nucleation, the step cooling mode of LPE growth (which is described by J.J. Hseih in "Liquid Phase Epitaxy", Chapter 6 of *Handbook on Semiconductors* Vol. 3, T.S. Moss and S.P. Keller, eds., Amsterdam, North-Holland, 1980 and is incorporated by reference herein) was used to achieve a high degree of initial supersaturation. Melts comprised 7 grams of Bi and 50 to 200 milligrams of Ga. For n-type doping, Sn was added to the melt. The melt was equilibrated with an undoped GaAs source wafer at a predetermined temperature selected from the range of 700° to 900° C. for at least 60 minutes to insure saturation. After equilibration, the source wafer was separated from the melt and the melt was step cooled by a selected temperature difference of 5 to 20° C.

A silicon substrate 10 having a silicon dioxide growth mask 12 with vias 14 and a CSVT GaAs interlayer 20 formed in accordance with steps 1 through 4 of this invention was brought into contact with the supercooled melt for times ranging from 20 seconds to 3 minutes yielding LPE GaAs semiconductor thicknesses of 0.3 to 3 microns. The best quality LPE GaAs semiconductor 30 was achieved by growing a 2 to 4 micron thick GaAs layer for 2 to 10 minutes on a 1 micron thick CSVT GaAs interlayer 20 on (111) oriented Si substrate 10 at an equilibration temperature of 825° C. with supercooling temperature difference of 15° C.

In a separate example, heteroepitaxial growth of AlGaAs (AlAs fraction=20 mole percent) was achieved in accord with the teachings of this invention by adding 2 milligrams of Al to the melt.

Light emitting diodes (LEDs) were fabricated on mesa structures which were selectively grown on patterned, oxide masked silicon substrates according to the teachings of this invention. A silicon wafer was masked with a 0.2 micron thick thermally grown oxide. A 100 micron wide stripe pattern was formed by photolithography and an opening in the oxide formed by etching in buffered hydrofluoric acid. A 1.5 micron thick interlayer of n-type GaAs was grown in the opening by CSVT. Next, an additional 0.2 micron oxide layer was deposited by electron beam evaporation. A 100×100 micron opening in the second oxide layer and located directly over the stripe was formed using photolithography and etching. In this second opening, a 1.2 micron thick Ge doped p-type AlGaAs (AlAs fraction=0.2) was grown selectively by LPE. In this example, the CSVT GaAs functioned both as an interlayer in accord with the teachings of this invention and as the luminescent base of the LED while the LPE AlGaAs functioned as the LED emitter. A gold-germanium dot provided for ohmic contact to the p-type AlGaAs:Ge emitter and a gold-zinc stripe formed the ohmic contact to the n-GaAs base. Stable light emission was observed from these devices.

For heteroepitaxial growth of InP as semiconductor material 30, LPE growth Step 5 has been carried out using melts, comprising either Sn and In, with proportions of 75 atomic percent Sn and 25 atomic per cent In or, preferably, with Bi and In in equal atomic proportions. LPE growth of InP over a CSVT InP interlayer from Bi+In melts was found to occur at lower growth rates than from Sn+In melts. Lower LPE growth rates in step 5 are useful for precise control of thickness. Moreover, InP grown from Bi+In melts had significantly lower (3E17 $cm^{-3}$ compared to 5E19 $cm^{-3}$) n-type carrier concentrations than those grown from Sn+In when the LPE conditions are selected to prevent back doping due to dissolution of the Si substrate. This is advantageous for optoelectronic device fabrication requiring counter-doping with p-type dopants.

The conductivity type and carrier concentration of the LPE InP are controlled by addition of dopants to the solution. For n-type doping, addition of Sn is suitable; while for p-type doping, Zn or Cd may be used and Cd is preferred.

For example, a CSVT InP interlayer 20 on a silicon substrate 10 that had been provided with a thermal oxide mask 12 and stripe vias 14 was employed to seed the LPE growth of InP semiconductor 30 from a Bi+In melt using a 5 to 10° C. step cool followed by a 15 minute isothermal LPE growth. The melt was equilibrated with an undoped InP source wafer at selected temperatures ranging from 650° C. to 670° C. for approximately 45 minutes to insure saturation. The LPE apparatus was provided with InP cover and source of P vapor to assure a sufficient partial pressure of phosphorus to avoid loss of P from the InP interlayer during equilibration. Methods for providing an over-pressure to prevent loss of P from InP in LPE processing are known in the art, such as the publication entitled "Preservation of Indium Phosphide Substrates" by B.H. Chin et al. which appeared in the *Journal of the Electrochemical Society* Vol. 133, No. 10 (1986) pp. 2161-2164. Loss of P is associated with formation of pits and In droplets. Reducing P loss was found by applicants to minimize growth defects in the LPE InP formed in accord with the teachings of this invention. LPE growth occurred when the substrate was brought in contact with the melt which was cooled 5° to 10° C. Smith morphology InP films on Si were achieved by growing a 2 micron thick InP layer 30 over a 0.2 micron thick InP interlayer 20 on (111) oriented Si substrate 10 from a 5° C. step cooled In/Bi melt saturated at 670° C. and grown at 665° C., followed by a 0.5 micron p-type InP layer grown from a two phase In melt with Cd doping for 5 minutes at a ramp of 0.17° C. per minute starting at 665° C.

The invention further encompasses fabrication of devices for which selective area growth may be undesirable or unnecessary. That is, non-selective or planar growth of a semiconductor on a non-lattice-matched substrate is contemplated for applications where the advantages of the stress-relieving features of selective area growth are less desirable than the lower cost expected from reduction of processing steps. Examples include devices utilizing a thin, i.e., less than 2 microns thick, layer of semiconductor 30 in which stresses due to the substrate are minimal and majority carrier devices, such as field effect transistors (FET), whose performance is generally not degraded by the effects of a dissimilar substrate on minority carriers. In such cases, steps 2 and 3, comprising formation of a patterned oxide growth mask, are omitted and interlayer 20 is formed by CSVT over essentially the entire surface of substrate 10 and semiconductor 30 is grown over the interlayer by LPE following the procedures set forth herein.

What is claimed:

1. A process for forming a layer of compound semiconductor material on a nonlattice matched substrate comprising the steps of forming a growth mask on a surface of the substrate, forming openings in the growth mask to expose areas of the substrate, forming an interlayer only on the exposed areas of the substrate by close-spaced-vapor-transport on the exposed areas in the openings of the growth mask, and forming the compound semiconductor layer over the interlayer by liquid phase epitaxy and using the interlayer in the exposed areas to seed the growth of the compound semiconductor layer.

2. The process of claim 1 wherein the interlayer is selected to enhance nucleation of the semi conductor material.

3. The process of claim 2 wherein the substrate is single crystal silicon and the compound semiconductor material is comprised of elements chosen from Groups III and V of the Periodic Table.

4. The process of claim 3 wherein the compound semiconductor material is GaAs and the interlayer is GaAs.

5. The process of claim 3 wherein the compound semiconductor is GaAs alloyed with AlAs in the amount of 20 mole per cent AlAs and the interlayer is GaAs.

6. The process of claim 3 wherein the compound semiconductor is InP and the interlayer is InP.

7. The process of claim 1 wherein the interlayer is GaAs and the close-spaced-vapor-transport step includes providing water vapor as a transporting agent.

8. The process of claim 1 wherein the interlayer is InP and the close-spaced-vapor-transport step includes providing hydrogen chloride as a transporting agent.

9. The process of claim 1 wherein the compound semiconductor is GaAs and the liquid phase epitaxy step includes providing a melt comprising a metal solvent comprising Bi.

10. The process of claim 1 wherein the compound semiconductor is InP and the liquid phase epitaxy step includes providing a melt comprising a solvent which is a mixture of Bi and In.

11. The process of claim 1 Wherein the compound semiconductor is InP and the liquid phase epitaxy step includes providing an InP cover to prevent loss of P.

12. The process of claim 1 wherein the compound semiconductor is InP and the liquid phase epitaxy step includes providing a source of P vapor species to prevent loss of P.

13. The process of claim 1 wherein the step of forming the interlayer includes doping the interlayer.

14. The process of claim 1 wherein the step of forming the compound semiconductor by liquid phase epitaxy includes providing dopants selected to obtain a desired conductivity type and concentration.

15. The process of claim 1 wherein the step of forming the compound semiconductor by liquid phase epitaxy includes step cooling to achieve a high degree of supersaturation.

16. The process of claim 1 where the step of providing a growth mask comprises growing a layer of silicon dioxide or silicon nitride over the substrate and forming an array of openings in said layer.

17. The process of claim 16 wherein the substrate is silicon and the step of providing the growth mask comprises growing a layer of silicon dioxide by thermal oxidation and forming an array of openings in the silicon dioxide by photolithography and chemical etching.

18. The process of claim 16 wherein the substrate is silicon and the step of providing the growth mask comprises selected area deposition by electron beam of silicon dioxide through an evaporation mask onto the substrate.

19. The process of claim 16 wherein the array of openings is a pattern comprising parallel stripes.

20. The process of claim 1 wherein the step of forming the compound semiconductor by liquid phase epitaxy includes lateral overgrowth of the semiconductor to form a continuous layer over the growth mask.

21. A process for fabricating a light emitting diode on a silicon substrate comprising the steps of: forming a silicon dioxide growth mask having an array of openings on the surface of the substrate; forming only on the exposed areas of substrate by close-spaced-vapor-transport growth on the exposed areas in openings in the growth mask an interlayer of a doped semiconductor material which functions as a base region of the light emitting diode and as a nucleation enhancing interlayer; and forming an emitter region of an oppositely doped compound semiconductor material over the interlayer by liquid phase epitaxy and using the interlayer in the exposed areas to seed the growth of the compound semiconductor material.

22. The process of claim 21 wherein the step of selectively forming the base region comprises close-spaced-vapor-transport growth of n-type GaAs using water vapor as a transporting agent and the step of forming the emitter region comprises liquid phase epitaxy growth of p-type AlGaAs containing 20 mole percent AlAs from a Bi solvent.

23. The process of claim 1 wherein close-spaced-vapor-transport includes providing a transport agent at a flow rate to remove oxides which form on the substrate.

24. The process of claim 1 wherein close-spaced-vapor-transport includes maintaining a sufficient temperature difference between a source and the substrate so that the interlayer only forms on the exposed areas of the substrate.

25. The process of claim 24 wherein the temperature difference between the source and the substrate is between 25 to 100° C.

26. The process of claim 1 wherein the liquid phase epitaxy step includes providing a melt comprising a metal solvent comprising Bi.

* * * * *

UNITED STATES PATENT AND TRADEMARK OFFICE
CERTIFICATE OF CORRECTION

PATENT NO.   : 5,356,509
DATED        : October 18, 1994
INVENTOR(S)  : Terranova et al.

It is certified that error appears in the above-identified patent and that said Letters Patent is hereby corrected as shown below:

On title page, item [75] should read as follows:

[75] Inventors: Nancy Terranova, Wilmington; Allen M. Barnett, Newark; Michael G. Mauk, Wilmington; Sandra R. Collins, Greenville, all of Delaware Col 6, Line 67 selected to enhance nucleation of the semiconductor

Col 7, Line 28

11. The process of claim 1, wherein the compound

Signed and Sealed this

Tenth Day of January, 1995

Attest:

BRUCE LEHMAN

*Attesting Officer*    *Commissioner of Patents and Trademarks*